(12) United States Patent
Ren

(10) Patent No.: US 7,507,486 B2
(45) Date of Patent: Mar. 24, 2009

(54) ORGANIC PHOSPHORESCENT LIGHT EMITTING DEVICE

(75) Inventor: Xiaofan Ren, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 508 days.

(21) Appl. No.: 11/216,948

(22) Filed: Aug. 31, 2005

(65) Prior Publication Data

US 2007/0048546 A1 Mar. 1, 2007

(51) Int. Cl.
*H01L 51/54* (2006.01)
*C09K 11/06* (2006.01)

(52) U.S. Cl. .............. 428/690; 428/917; 313/504; 313/506; 257/40; 257/E51.044; 548/101; 548/103; 548/108; 546/4

(58) Field of Classification Search .......... None
See application file for complete search history.

(56) References Cited

U.S. PATENT DOCUMENTS

| | | | |
|---|---|---|---|
| 6,911,677 B2 | 6/2005 | Igarashi | |
| 2002/0068190 A1* | 6/2002 | Tsuboyama et al. | 428/690 |
| 2002/0134984 A1 | 9/2002 | Igarashi | |
| 2004/0091738 A1 | 5/2004 | Psai et al. | |
| 2004/0137267 A1* | 7/2004 | Igarashi et al. | 428/690 |
| 2004/0137268 A1 | 7/2004 | Igarashi et al. | |
| 2006/0078760 A1 | 4/2006 | Ragini et al. | |
| 2006/0240282 A1* | 10/2006 | Lin | 428/690 |

FOREIGN PATENT DOCUMENTS

WO 2004/085450 10/2004

* cited by examiner

*Primary Examiner*—Marie R. Yamnitzky
(74) *Attorney, Agent, or Firm*—Arthur E. Kluegel; Raymond L. Owens

(57) ABSTRACT

An OLED device comprises a cathode, an anode, and located therebetween a light emitting layer containing a compound represented by formula (I):

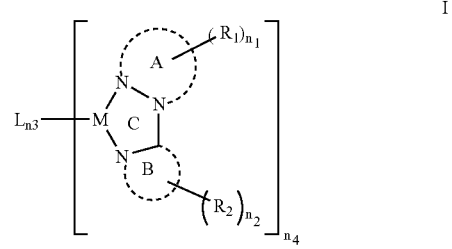

wherein
M is a d-block transition metal of atomic number greater than 40;
the coordination ring C is a triazole ring with the metal as a member of the triazole ring;
A is a five- or six-membered ring;
B is a five- or six-membered ring;
$R_1$ and $R_2$ are groups other than hydrogen and may be joined together;
$n_1$ and $n_2$ are independently an integer from 0 to 6;
L is a ligand;
$n_3$ is zero or an integer
and $n_4$ is an integer of at least one.

9 Claims, 1 Drawing Sheet

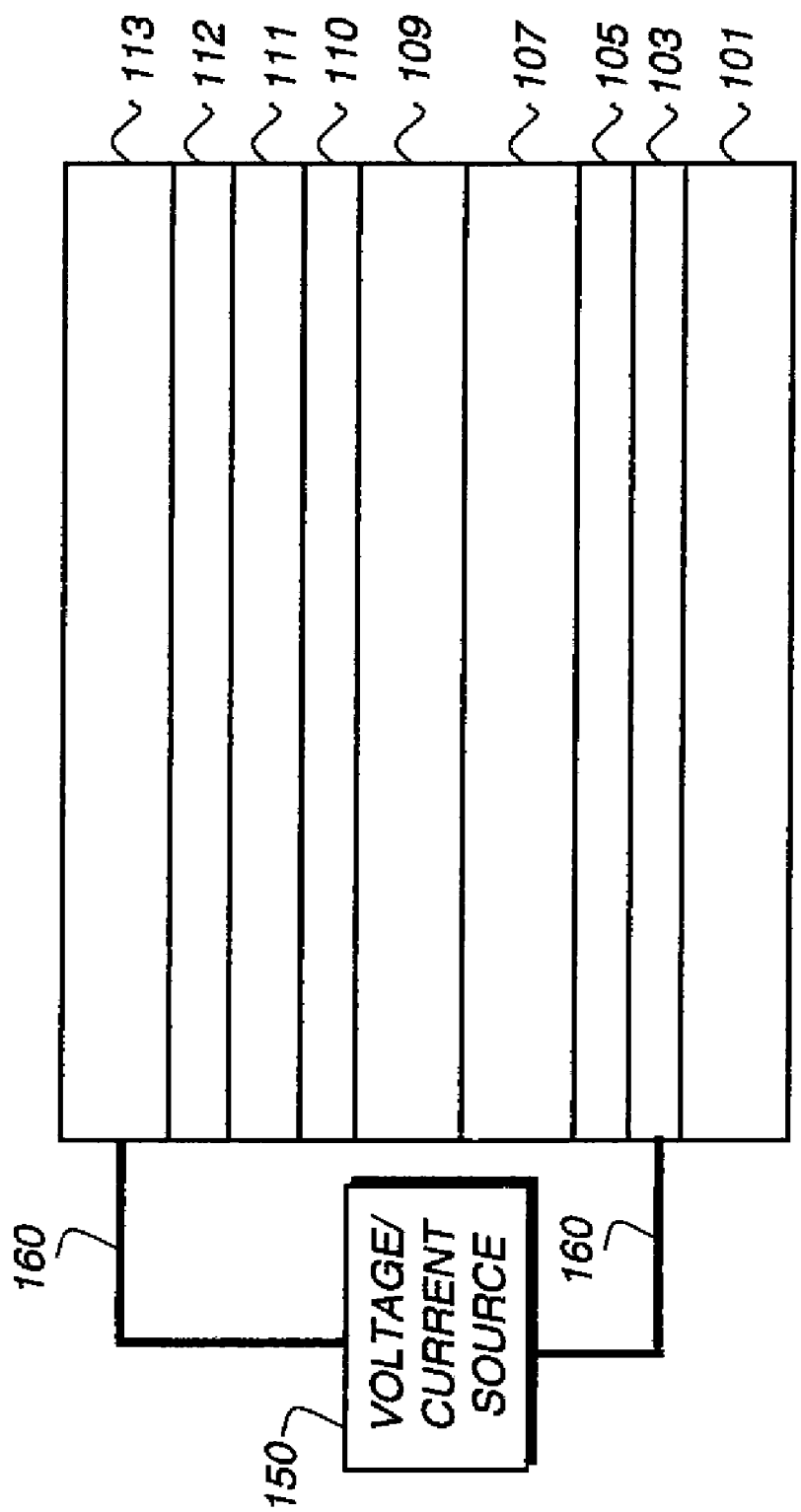

ORGANIC PHOSPHORESCENT LIGHT EMITTING DEVICE

FIELD OF INVENTION

This invention relates to organic electroluminescent (EL) devices. More specifically, this invention relates to efficient blue electroluminescent devices incorporating an organic phosphorescent iridium (III) complex.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot readily transfer their energy to the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is, possible, by the proper choice of host and dopant, to collect energy from both the singlet and triplet excitons created in an OLED device and to produce a very efficient phosphorescent emission.

In the 1990s the efficient emission of light from the triplet excited states of electrically excited molecules was observed (Baldo et al. Applied Physics Letters 75, 4, (1999)). This electroluminescent system comprised a green light emitting cyclometallated iridium phenylpyridine complex and showed a higher efficiency than had previously been observed in fluorescent systems. This phenomenon, known as electro-phosphorescence, has been widely investigated. US 2002/0134984 discloses a series of iridium complexes in which iridium is coordinated to a bidentate ligand via two nitrogen atoms, such as compound 1 shown below. WO 2004/085450 discloses a series of iridium complexes in which iridium is coordinated to a ligand comprising a phenylpyrazole derivative, such as compound 2. WO2002/15645 discloses the blue phosphorescent complex 3, known as Firpic, as shown below.

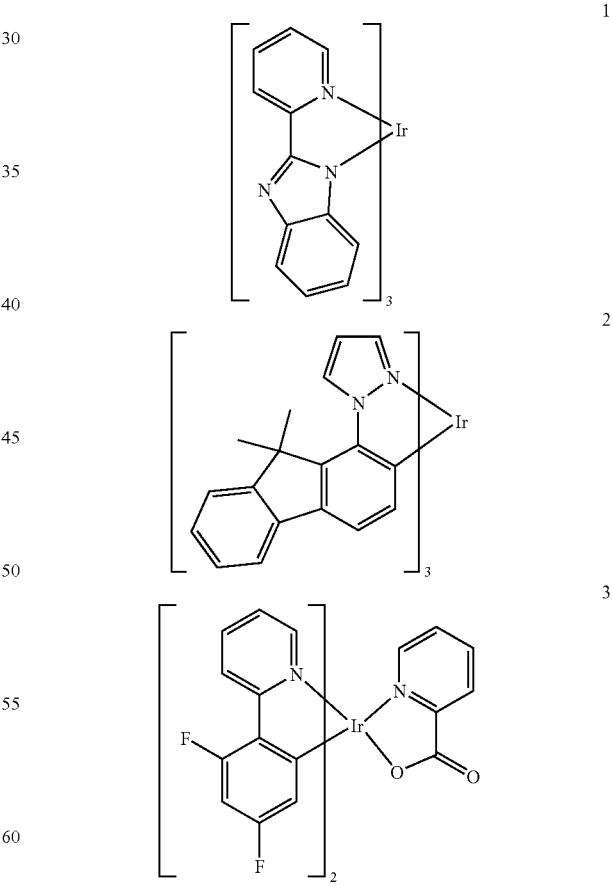

Much of the development of organic light emitting devices is aimed at the exploitation of these devices in display applications such as mobile phones and large area displays. Full color displays require light emitting materials that emit light in the red, green and blue regions of the UV-Vis spectrum. Fluorescent organic materials capable of emitting red, green and blue light have been developed.

Phosphorescent materials emitting red and green light have been developed but there are relatively few examples of phosphorescent materials capable of emitting blue light. Although the above-mentioned iridium complex Firpic emits blue light, this is of a light blue color rather than the deeper blue required for full color displays. To achieve a close match to the National Television Standards Committee (NTSC) recommended blue for a video display, the blue phosphors used in OLEDs should have CIE (Commission International l'Eclairage) coordinates (x+y) desirably no larger than 0.33.

Notwithstanding these developments, there remains a need for new efficient phosphorescent materials, particularly materials that produce their emission in the technologically useful blue colors of the UV-Vis spectrum.

SUMMARY OF THE INVENTION

OLED device comprising a cathode, an anode, and located therebetween a light emitting layer containing a compound represented by formula (I):

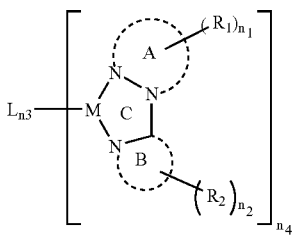

wherein

M is a d-block transition metal of atomic number greater than 40;

the coordination ring C is a triazole ring with the metal as a member of the triazole ring;

A is a five- or six-membered heteroaryl ring comprising at least two nitrogen atoms and is optionally substituted and optionally fused to one or more other aryl or heteroaryl rings;

B is a five- or six-membered heteroaryl ring comprising at least one nitrogen atom and is optionally substituted and optionally fused to one or more other aryl or heteroaryl rings;

$R_1$ an $R_2$ are groups other than hydrogen an may be joined together;

$n_1$ and $n_2$ are independently an integer from 0 to 6;

L is a ligand;

$n_3$ is zero or an integer;

and $n_4$ is an integer of at least one.

Specific embodiments of the present invention are directed to OLEDs using emissive phosphorescent organometallic compounds that produce improved electrophosphorescence in the blue region of the visible spectrum.

BRIEF DESCRIPTION OF THE DRAWINGS

The FIGURE shows a schematic cross-section of a typical OLED device of this invention.

DETAILED DESCRIPTION OF THE INVENTION

The invention is generally described in the Summary of the Invention. A light emitting device of the present invention comprises a transition metal complex containing a moiety represented by formula I.

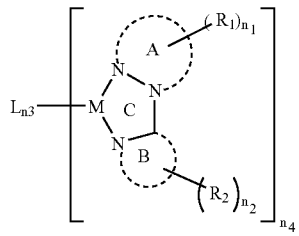

In Formula (I), M is a d-block transition metal having an atomic number greater than 40. Preferably selected from metals Ir, Pt, Pd, Rh, Re, Ru, Os, Tl, W, Pb, Bi, In, Sn, Sb, Au and Ag. More preferably, the metal is Pt or Ir. Multiple ligands may be attached to the metal.

At least one of the coordination rings C in the complex is a triazole ring with the metal as a member of the triazole ring. In the triazole ring, two of the covalently linked nitrogen atoms are provided by a heteroaryl ring, termed A, comprising at least two nitrogen atoms. The other nitrogen atom is also provided by a heteroaryl ring, termed B, comprising at least one nitrogen atom. Ring A may suitably be a pyrazole, an oxadiazole, a thiadiazole, a triazole, a tetrazole, a pyridazine, or a triazine. "$n_4$" represents the number of this type of ligands in the structure. "$n_4$" is at least one, and may be any integer greater than zero up to the maximum number of ligands that may be attached to the metal.

L represents a ligand that is able to coordinate to the metal stably. Preferred ligands include any mono-anionic ligand. L may coordinate to the metal in a single or multiple locations. For example, L may be a bidentate ligand. $n_3$ represents the number of ligands L in the structure. $n_3$ may be zero, and may be an integer greater than zero, subject to the requirement that $n_4$ is at least one. For iridium, to which 3 bidentate ligands may be attached, $n_4$ may be 1, 2 or 3, and $n_3$ may be 0, 1 and 2.

Ring A may be unsubstituted or substituted by one or more $R_1$ groups. Suitable $R_1$ groups include alkyl, alkenyl, alkoxy, aryl, aralkyl, halogen, $NH_2$, NHR, $NR_2$, $NO_2$, CN, C(O)OR, C(O)R, C(O)NR, P(O)RR', P(S)RR', $SO_2$, SOR, $SO_2R$, $SO_3R$, BRR', and $B(OR)_2$. Ring A may also be optionally fused to one or more other aryl or heteroaryl rings.

The compounds of the present invention are, in a preferred embodiment, intended for use in a luminescent device. Generally such a device will comprise an organic layer which comprises the compound of the present invention disposed in some manner between two electrodes, one a cathode and the other a anode.

In a preferred embodiment the emissive layer comprises host material. The host material could be a polymer, a dendrimer or a small-molecular base compound. The host material can also be used together with another host material (co-host system). The host material may comprise an electron transporting material that conducts charge primarily by the transport of electrons. Alternatively the host material may comprise a hole transporting material that conducts charge primarily by the transport of holes. The organometallic compound described can be doped in the host material of the light emitting device. The energy level of the lowest triplet energy excited state of the host material is higher than the energy level of the lowest triplet energy excited state of the organometallic compound. In a preferred embodiment of the present invention the energy difference between the lowest triplet energy excited state of the organometallic compound and a corresponding relaxed state of the organometallic compound corresponds with a wavelength of less than approximately 520 nm. More preferably the energy difference between the lowest triplet energy excited state of the organometallic compound and a corresponding relaxed state of the organometallic compound corresponds with a wavelength of between approximately 420 nm and approximately 480 nm.

In one embodiment, ring A is represented by formula II:

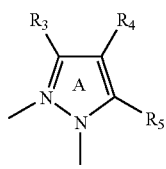

II

In formula II, $R_3$, $R_4$ and $R_5$ may be selected from alkyl, alkenyl, alkoxy, aryl, aralkyl, halogen, $NH_2$, NHR, $NR_2$, $NO_2$, CN, C(O)OR, C(O)R, C(O)NR, P(O)RR', P(S)RR', $SO_2$, SOR, $SO_2R$, $SO_3R$, BRR', and $B(OR)_2$. Preferably at least one of the three substituents in formula II is electron donating. More preferably, all substituents in formula II are electron donating. Particularly preferred $R_3$, $R_4$ and $R_5$ groups include $C_{1-6}$ alkyl, $C_{1-6}$ alkoxy, $C_{1-6}$ alkylamino, di($C_{1-6}$ alkyl)amino, aryl, carbazole, arylamino, and diarylamino.

In an alterative embodiment $R_3$, $R_4$ and $R_5$ may be electron-withdrawing groups, for example substituted by one or more halogen atom, haloalkyl groups or aryl groups.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups.

In one embodiment, ring B is substituted to contain fused ring D as represented by formula III:

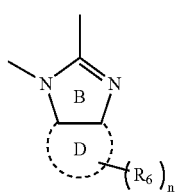

III

Ring D may be any aryl or heteroaryl ring. Preferably, ring D is an aryl ring, because a heteroaryl D ring may be difficult to synthesize. Aryl rings are also preferred over heteroaryl rings because it is believed that device stability is better when D is an aryl ring. Preferably, ring D is a 5 or 6-membered aryl ring system. Ring D may incorporate a single or multiple heteroatoms. Nitrogen is an example of a suitable heteroatom. Ring D may contain substituents. H or any substituents may be used on ring D. Preferred substituents for $R_6$ include alkyl, alkenyl, alkoxy, aryl, aralkyl, halogen, $NH_2$, NHR, $NR_2$, $NO_2$, CN, C(O)OR, C(O)R, C(O)NR, P(O)RR', P(S)RR', $SO_2$, SOR, $SO_2R$, $SO_3R$, BRR', and $B(OR)_2$. Ring D may also be optionally fused to one or more other aryl or heteroaryl rings. n is zero or an integer equal to or greater than one. A preferred example of Formula (III) is shown in Formula (IV)

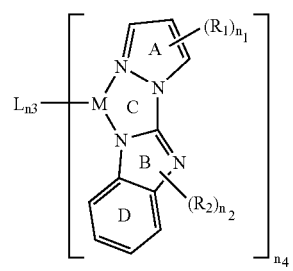

IV wherein
M is Ir or Pt;
$R_1$ an $R_2$ are groups other than hydrogen;
$n_1$ and $n_2$ are independently an integer from 0 to 6;
L is a ligand;
$n_3$ is 0 or an integer up to 3;
and $n_4$ is an integer from 1 to 3.

The complex of the present invention may be homoleptic or heteroleptic. In a homoleptic complex all ligands are identical ($n_3$=0); in a heteroleptic complex different ligands are coordinated to the metal ($n_3$>0). Examples of suitable ligands which may be used to form heteroleptic complexes in the present invention, may be selected from those known in the art. Preferred cyclometallating ligands are 2-phenylpyridines and phenylpyrazoles and derivatives thereof.

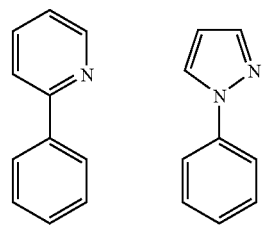

The phenylpyridine or phenylpyrazole cyclometallated ligand may be optionally substituted with one or more alkyl, alkenyl, alkynyl, alkylaryl, CN, $CF_3$, COOR, C(O)R, $NR_2$, $NO_2$, OR, halo, aryl, heteroaryl, substituted aryl, substituted heteroaryl or a heterocyclic group, and additionally, or alternatively, any two adjacent substituted positions together form, independently, a fused 5- to 6-membered cyclic group, wherein said cyclic group is cycloalkyl, cycloheteroalkyl, aryl, or heteroaryl, and wherein the fused 5- to 6-membered cyclic group may be optionally substituted with one or more of alkyl, alkenyl, alkynyl, alkylaryl, CN, $CF_3$, COOR, C(O)R, $NR_2$, $NO_2$, OR or halo and each R is independently alkyl, alkenyl, alkynyl, aralkyl, and aryl.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

Unless otherwise specified, the term "percentage" or "percent" and the symbol "%" of a material indicates the volume percent of the material in the layer in which it is present.

Useful compounds of this invention include:
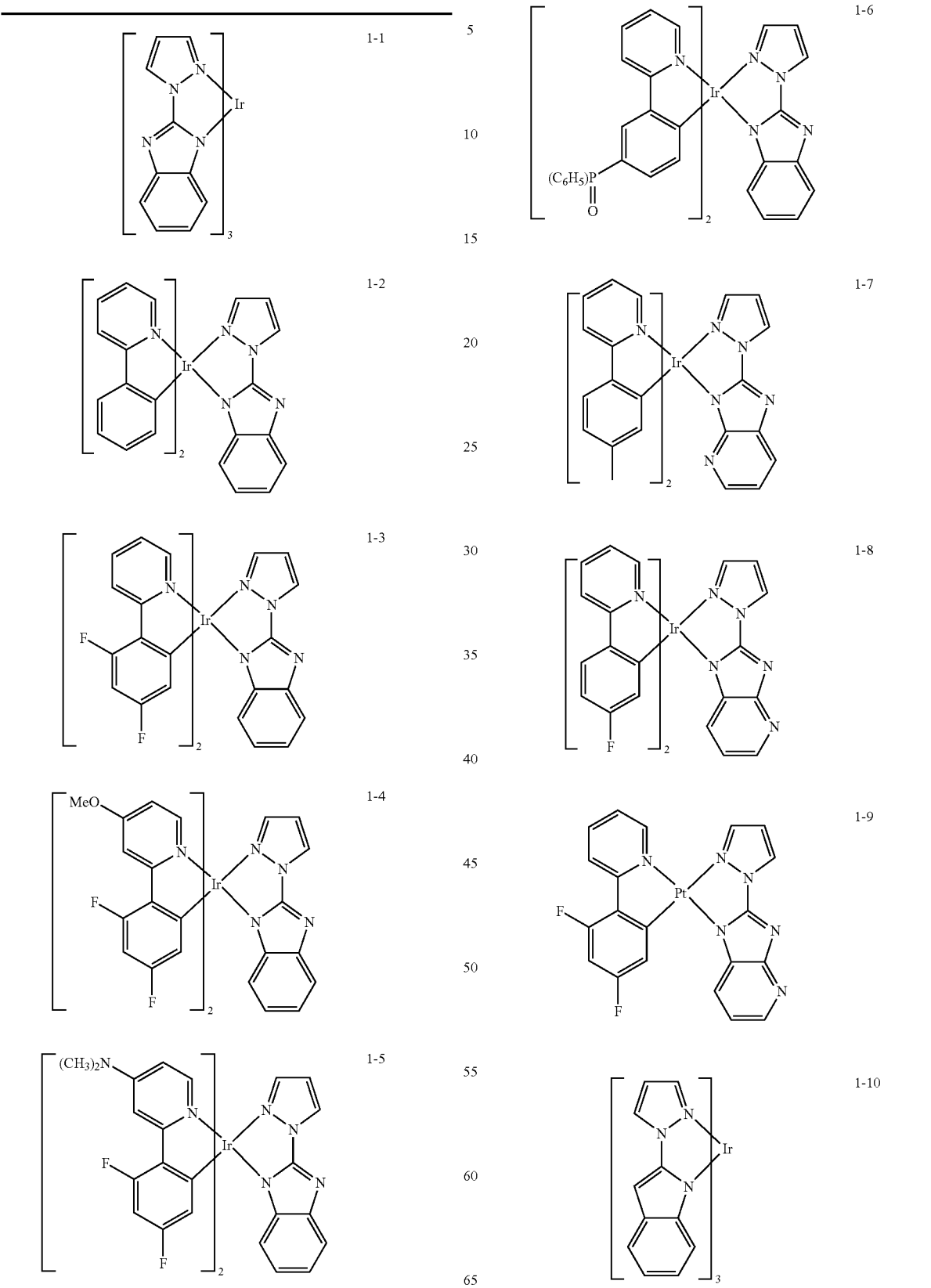

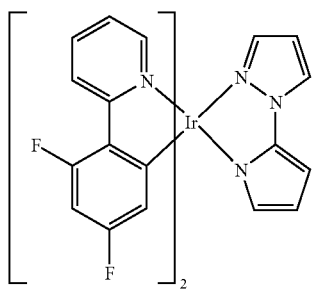

1-11

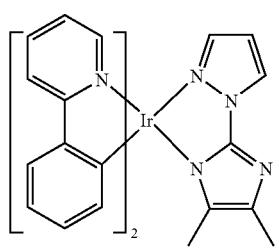

1-12

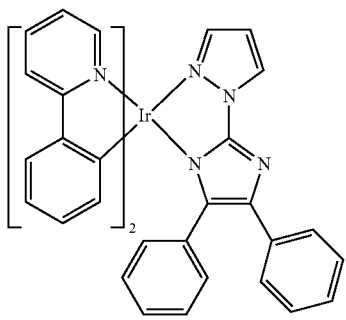

1-13

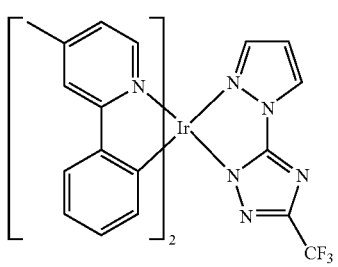

1-14

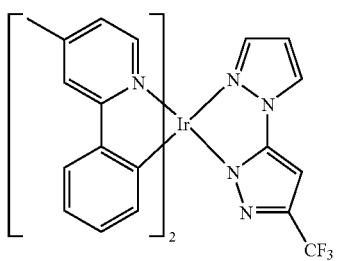

1-15

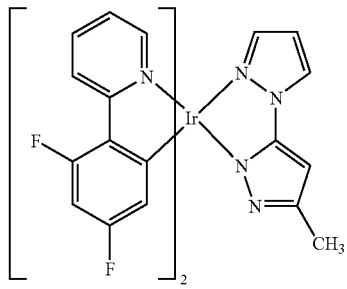

1-16

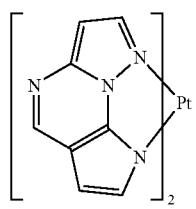

1-21

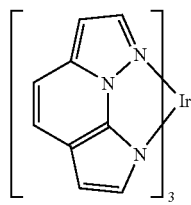

1-22

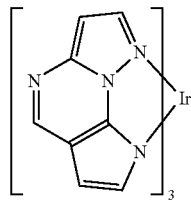

1-23

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in FIG. 1 and is comprised of a substrate 101, an anode 103, a hole-injecting layer 105, a hole-transporting layer 107, a light-emitting layer 109, an optional hole- or exciton-blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate.

Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

A hole-injecting layer 105 may be provided between the anode and the hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, some aromatic amines, for example, MTDATA (4,4',4"-tris[(3-methylphenyl)phenylamino] triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

The thickness of a hole injection layer containing a plasma-deposited fluorocarbon polymer can be in the range of 0.2 nm to 15 nm and suitably in the range of 0.3 to 1.5 nm.

Hole-Transporting Layer (HTL)

It is usually advantageous to have a hole transporting layer 107 deposited between the anode and the emissive layer. A hole transporting material deposited in said hole transporting layer between the anode and the light emitting layer may be the same or different from a hole transporting compound used as a co-host or in exciton blocking layer according to the invention. The hole transporting layer may optionally include a hole injection layer. The hole transporting layer may include more than one hole transporting compound, deposited as a blend or divided into separate layers.

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural formula (HT1):

(HT1)

wherein $Q_1$ and $Q_2$ are independently selected aromatic tertiary amine moieties, and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (HT1) and containing two triarylamine moieties is represented by structural formula (HT2):

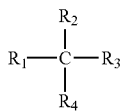

(HT2)

wherein
R₁ and R₂ each independently represents a hydrogen atom, an aryl group, or an alkyl group or R₁ and R₂ together represent the atoms completing a cycloalkyl group and R₃ and R₄ each independently represents an aryl group, which is in turn substituted with a diaryl substituted amino group, as indicated by structural formula (HT3):

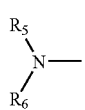

(HT3)

wherein
R₅ and R₆ are independently selected aryl groups. In one embodiment, at least one of R₅ or R₆ contains a polycyclic fused ring structure, e.g., a naphthalene.

Another class of aromatic tertiary amines is the tetraaryldiamines. Desirable tetraaryldiamines include two diarylamino groups, such as indicated by formula (HT3), linked through an arylene group. Useful tetraaryldiamines include those represented by formula (HT4):

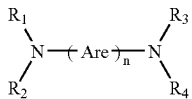

(HT4)

wherein
each Are is an independently selected arylene group, such as a phenylene or anthracene moiety,
n is an integer of from 1 to 4, and
R₁, R₂, R₃, and R₄ are independently selected aryl groups. In a typical embodiment, at least one of R₁, R₂, R₃, and R₄ is a polycyclic fused ring structure, e.g., a naphthalene.

The various alkyl, alkylene, aryl, and arylene moieties of the foregoing structural formulae (HT1), (HT2), (HT3), (HT4) can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

The hole transporting layer can be formed of a single tertiary amine compound or a mixture of such compounds. Specifically, one may employ a triarylamine, such as a triarylamine satisfying the formula (HT2), in combination with a tetraaryldiamine, such as indicated by formula (HT4). Illustrative of useful aromatic tertiary amines are the following:

1,1-Bis(4-di-p-tolylaminophenyl)cyclohexane (TAPC);
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(3-methylphenyl)-N-phenylamino]biphenyl (TPD);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenyl amino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'''-diamino-p-terphenyl;
4,4'-Bis {N-phenyl-N-[4-(1-naphthyl)-phenyl]amino}biphenyl;
2,6-Bis[N,N-di(2-naphthyl)amino]fluorine;
4,4',4''-tris[(3-methylphenyl)phenylamino]triphenylamine (MTDATA);
N,N-bis[2,5-dimethyl-4-[(3-methylphenyl)phenylamino]phenyl]-2,5-dimethyl-N'-(3-methylphenyl)-N'-phenyl-1,4-benzenediamine;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

Another class of useful hole-transporting materials includes polycyclic aromatic compounds as described in EP 1 009 041. Some hole-injecting materials described in EP 0 891 121 A1 and EP 1 029 909 A1, can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxythiophene)/poly(4-styrenesulfonate) also called PEDOT/PSS.

Light-Emitting Layer (LEL)

Suitably, the light-emitting layer of the OLED device comprises a host material and one or more guest materials for emitting light. At least one of the guest materials is suitably a fluorescent or phosphorescent material. The light-emitting guest material(s) is usually present in an amount less than the amount of host materials and is typically present in an amount of up to 15 wt % of the host, more typically from 0.1-10 wt % of the host. For convenience, the light-emitting guest material may be referred to as a light emitting dopant. A phosphorescent guest material may be referred to herein as a phosphorescent material, or phosphorescent dopant. The phosphorescent material is preferably a low molecular weight compound, but it may also be an oligomer or a polymer. It may be provided as a discrete material dispersed in the host material, or it may be bonded in some way to the host material, for example, covalently bonded into a polymeric host.

Fluorescent materials may be used in the same layer as the phosphorescent material, in adjacent layers, in adjacent pixels, or any combination. Care must be taken to select materials that will not adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

Host Materials for Phosphorescent Materials

Suitable host materials should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655; WO 01/39234; WO 01/93642; WO 02/074015; WO 02/15645, and US 20020117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Desirable host materials are capable of forming a continuous film. The light-emitting layer may contain more than one host material in order to improve the device's film morphology, electrical properties, light emission efficiency, and lifetime. The light emitting layer may contain a first host material that has good hole-transporting properties, and a second host material that has good electron-transporting properties. The following are examples of suitable host materials.

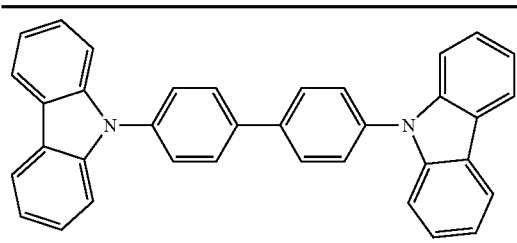

H1

-continued

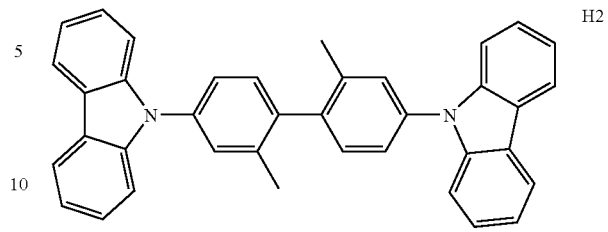

H2

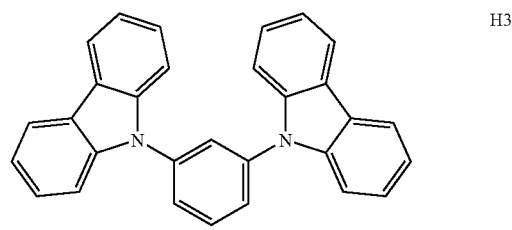

H3

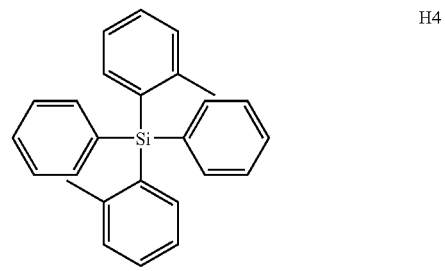

H4

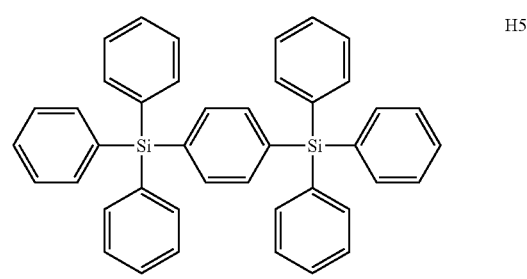

H5

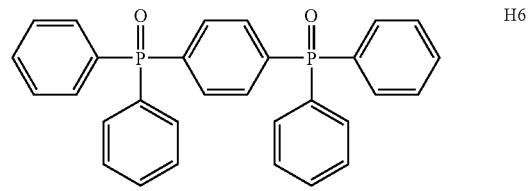

H6

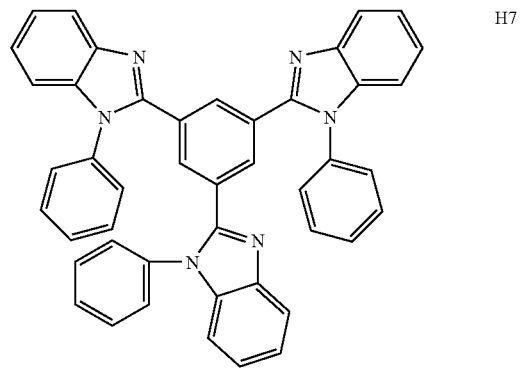

H7

-continued

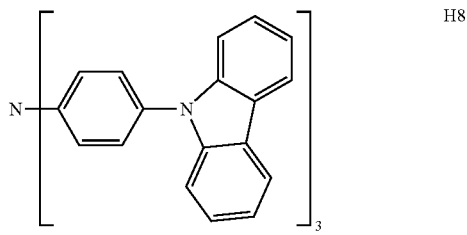

H8

Phosphorescent Materials

Phosphorescent materials may be used singly or in combination with other phosphorescent materials, either in the same or different layers. Some other phosphorescent materials are described in WO 00/57676, WO 00/70655, WO 01/41512, WO 02/15645, US 2003/0017361, WO 01/93642, WO 01/39234, U.S. Pat. No. 6,458,475, WO 02/071813, U.S. Pat. No. 6,573,651, US 2002/0197511, WO 02/074015, U.S. Pat. No. 6,451,455, US 2003/0072964, US 2003/0068528, U.S. Pat. Nos. 6,413,656, 6,515,298, 6,451,415, 6,097,147, US 2003/0124381, US 2003/0059646, US 2003/0054198, EP 1 239 526, EP 1 238 981, EP 1 244 155, US 2002/0100906, US 2003/0068526, US 2003/0068535, JP 2003073387, JP 2003073388, US 2003/0141809, US 2003/0040627, JP 2003059667, JP 2003073665, and US 2002/0121638.

The emission wavelengths of cyclometallated Ir(III) complexes of the type $IrL_3$ and $IrL_2L'$, such as the green-emitting fac-tris(2-phenylpyridinato-N,$C^{2'}$)Iridium(III) and bis(2-phenylpyridinato-N,$C^{2'}$)Iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,$C^{3'}$)Iridium(III)(acetylacetonate) and tris(2-phenylisoquinolinato-N,C)Iridium(III). A blue-emitting example is bis(2-(4,6-diflourophenyl)-pyridinato-N,$C^{2'}$)Iridium(III)(picolinate).

Red electrophosphorescence has been reported, using bis (2-(2'-benzo[4,5-a]thienyl)pyridinato-N,$C^3$) iridium (acetylacetonate) [$Btp_2Ir(acac)$] as the phosphorescent material (Adachi, C., Lamansky, S., Baldo, M. A., Kwong, R. C., Thompson, M. E., and Forrest, S. R., *App. Phys. Lett.*, 78, 1622-1624 (2001).

Other important phosphorescent materials include cyclometallated Pt(II) complexes such as cis-bis(2-phenylpyridinato-N,$C^{2'}$)platinum(II), cis-bis(2-(2'-thienyl)pyridinato-N, $C^{3'}$) platinum(II), cis-bis(2-(2'-thienyl)quinolinato-N,$C^{5'}$) platinum(II), or (2-(4,6-diflourophenyl)pyridinato-NC2') platinum (II) acetylacetonate. Pt(II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al, *Appl. Phys. Lett.*, 65, 2124 (1994))

Blocking Layers

In addition to suitable hosts and transporting materials, an OLED device employing a phosphorescent material often requires at least one exciton or hole blocking layer to help confine the excitons or electron-hole recombination centers to the light emitting layer comprising the host and phosphorescent material. In one embodiment, such a blocking layer 110 would be placed between the electron transporting layer and the light emitting layer—see FIG. 1. In this case, the ionization potential of the blocking layer should be such that there is an energy barrier for hole migration from the light emitting layer into the electron-transporting layer, while the electron affinity should be such that electrons pass readily from the electron transporting layer into the light emitting layer. It is further desired, but not absolutely required, that the triplet energy of the blocking material be greater than that of the phosphorescent material. Suitable hole blocking materials are described in WO 00/70655 and WO 01/93642. Two examples of useful materials are bathocuproine (BCP) and bis(2-methyl-8-quinolinolato)(4-phenylphenolato)Aluminum(III) (BAIQ). Metal complexes other than BAIQ are also known to block holes and excitons as described in US 20030068528. US 20030175553 describes the use of fac-tris (1-phenylpyrazolato-N,C 2)iridium(III) (Irppz) in an electron/exciton blocking layer.

Electron-Transporting Layer (ETL)

The electron transporting material deposited in said electron transporting layer between the cathode and the light emitting layer may be the same or different from an electron transporting co-host material. The electron transporting layer may include more than one electron transporting compound, deposited as a blend or divided into separate layers.

Preferred thin film-forming materials for use in constructing the electron transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (ET1) below:

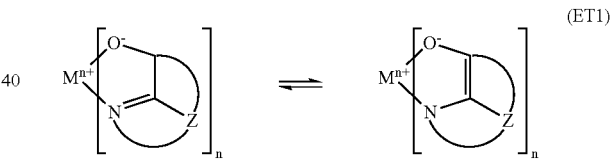

(ET1)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less. Illustrative of useful chelated oxinoid compounds are the following:

CO-1: Aluminum trisoxine [alias, tris(8-quinolinolato)aluminum(III); Alq];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)];
CO-9: Zirconium oxine [alias, tetra(8-quinolinolato)zirconium(IV)].

Other electron transporting materials suitable for use in the electron transporting layer include various butadiene derivatives as disclosed in U.S. Pat. No. 4,356,429 and various heterocyclic optical brighteners as described in U.S. Pat. No. 4,539,507. Benzazoles satisfying structural formula (ET2) are also useful electron transporting materials:

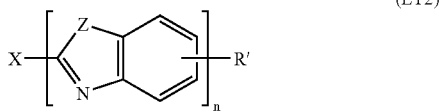

(ET2)

wherein n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together. An example of a useful benzazole is 2,2',2"-(1, 3,5-phenylene)tris[1-phenyl-1H-benzimidazole] (TPBI) disclosed in Shi et al. in U.S. Pat. No. 5,766,779.

Other electron transporting materials suitable for use in the electron transporting layer may be selected from phenanthrolines, triazines, triazoles, imidazoles, oxazoles, thiazoles and their derivatives, polybenzobisazoles, pyridine- and quinoline-based materials, cyano-containing polymers and perfluorinated materials.

The electron transporting layer or a portion of the electron transporting layer adjacent the cathode may further be doped with an alkali metal to form an electron injection layer 112 and reduce electron injection barriers and hence lower the drive voltage of the device. Suitable alkali metals for this purpose include lithium and cesium.

Cathode

When light emission is viewed solely through the anode 103, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, as disclosed in U.S. Pat. No. 6,013,384, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776, 622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,393. Cathode materials are typically deposited by any suitable methods such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823, 5,503,910, 5,405, 709, and 5,283,182, US 20020186214, US 20020025419, US 20040009367, and U.S. Pat. No. 6,627,333.

Additional layers such as hole-blocking 110, and exciton or electron blocking layers as taught in the art may be employed in devices of this invention. Hole-blocking layers are commonly used to improve efficiency of phosphorescent emitter devices, for example, as in US 20020015859, WO 00/70655A2, WO 01/93642A1, US 20030068528 and US 20030175553 A1

This invention may be used in so-called stacked device architecture, for example, as taught in U.S. Pat. Nos. 5,703, 436 and 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. Nos. 10/784,585; 10/805,980; 10/945,940; 10/945,941; 11/050,924; and 11/050,934. Using this second method, each material may be evaporated using different source evaporators or the solid materials may be mixed prior to evaporation using the same source evaporator Encapsulation Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device may have a microcavity structure. In one useful example, one of the metallic electrodes is essentially opaque and reflective the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

Embodiments of the invention may provide advantageous features such as operating efficiency, higher luminance, color hue, lower drive voltage, and improved operating stability. Embodiments of the organometallic compounds useful in the invention can provide a wide range of hues including those useful in the emission of white light (directly or through filters to provide multicolor displays).

EXAMPLES

Synthesis Example 1

Synthesis of ligand 2,4-difluorophenylpyrazole (dfppz)

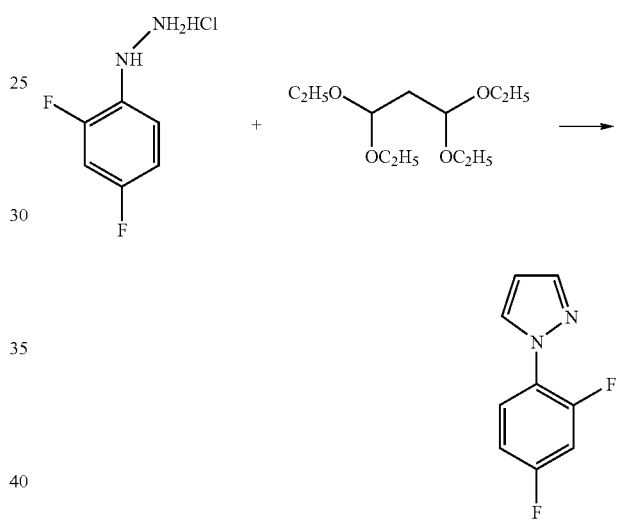

1,1,3,3-tetraethoxypropane and 1 equivalent 2,4-phenylhydrozine hydrochloride in 95% ethanol were refluxed for 30 min. The solution was cooled and all ethanol was evaporated. The residue was extracted with ether, dried and concentrated again. The pure product was obtained by distillation at reduced pressure.

Synthesis Example 2

Synthesis of ligand
2-3'-diphenylphosphineoxide-phenylpyridine (dphPOPy)

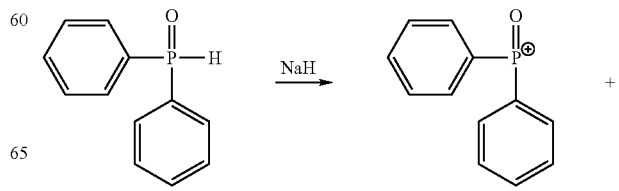

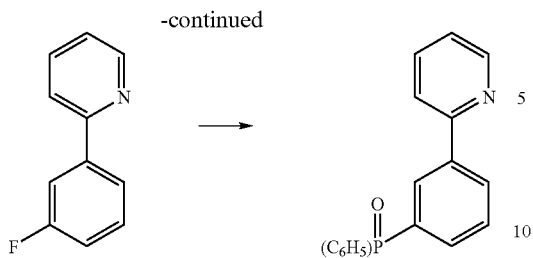

Sodium hydride (60% w/w in mineral oil) was added to a stirred solution of 1 equv. diphenylphosphineoxide in dry THF at room temperature under $N_2$. Hydrogen gas was evolved and the solution turned yellow immediately. After stirring for 30 min, 3'-fluorophenylpyridine was added. The solution was stirred for 16 hours at 140° C. The white precipitate of the reaction mixture was collected and purified by column chromatography.

Synthesis Example 3

Synthesis of ligand 3-2-(pyrazolyl)-1-benzimidazole (PzBid)

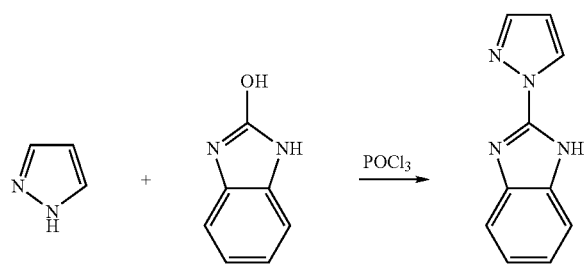

Pyrazole, 1 equiv 2-hydroxybenzimidazole, and 1.05 equiv $POCl_3$ was carefully mixed together. The mixture was brought to reflux for 3 hours under $N_2$. The reaction mixture was cooled and poured into a 3N HCl aqueous solution. The resulting mixture was stirred at 30-40° C. for 30 min. Active carbon was then added and filtered. The pH of the solution was adjusted to 7 with $NH_4OH$. The white precipitate was collected and purified by recrystallization in ethyl acetate.

Synthesis Example 4

General Synthetic Scheme for Ir Complexes 1-2, 1-3, 1-6.

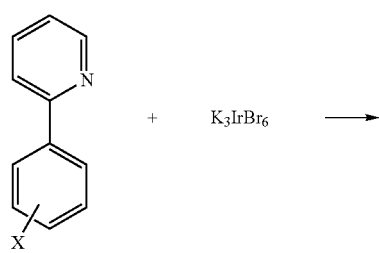

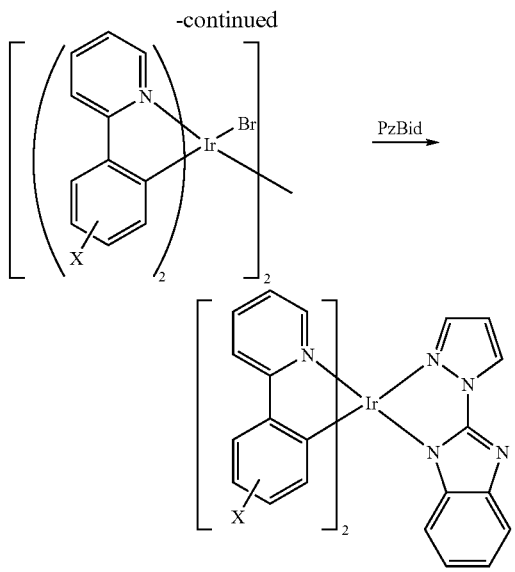

Reacting the ligand with $K_3IrBr_6$ in a 3:1 mixture of ethoxyethanol and water formed the dimer. The dimer, 1.1 equiv of pyrazolylbenzimidazole, 1.15 equiv NaOMe were heated to reflux under inert atmosphere in chloroform for 3-4 hours. After the mixture was cooled to room temperature, it was washed with water and dried with $MgSO_4$ and concentrated. The residue was then purified by silica gel chromatography to provide the complex.

Peak emissions and quantum yields of several inventive materials and comparison $Ir(dfPpy)_3$ as described below are shown in the following table:

| Compound | Room temperature peak emission (nm) | Quantum Yield |
| --- | --- | --- |
| 1-2 | 490 | 0.48 |
| 1-3 | 460 | 0.51 |
| 1-6 | 478 | 0.36 |
| Comp Ir(dfppy)$_3$ | 470 | 0.34 |

Device Example 1

4,4'-Bis[N-(1-naphthyl)-N-phenylamino]biphenyl (NPB) was vacuum deposited on a cleaned ITO substrate to a deposit thickness of 75 nm. The host material HM-8 and Ir complex 1-3 were vacuum co-deposited on the NPB layer at a weight ratio of 12.5:1 to a thickness of 35 nm. The HM-7 (functions as hole/exciton blocking layer) was vacuum deposited on the light-emitting layer at a thickness of 10 nm. A 40 nm layer of aluminum tris(8-hydroxyquinoline) (Alq) was vacuum deposited on the top of the neat HM-7 layer. A pattern mask (0.1 cm$^2$) was put on the thus formed organic thin film, and lithium fluoride was vacuum deposited to a thickness of 1 nm, and aluminum was then vacuum deposited to a thickness of 100 nm to complete an OLED.

The device was encapsulated in a dry box. On applying a DC voltage to the resulting OLED by use of Source-Measure Unit Model 2400, blue light emission was obtained. The blue luminescence had CIE chromaticity coordinate of (x, y)= (0.15, 0.25) [x+y=0.40] as measured with Spectral Analyzer. OLED maximum efficiency is 0.098 W/A.

Device Example 2 (Comparative)

An OLED was prepared in the same manner as in Device Example 1, except replacing complex 1-3 with Ir(dfppy)$_3$ shown below. The resulting OLED was evaluated in the same manner as in Example 1. Blue light emission was obtained. The blue luminescence had CIE chromaticity coordinate of (x, y)=(0.15, 0.36) [x+y=0.51] as measured with Spectral Analyzer. The chromaticity value is not as close to the desired 0.33 value as the inventive device above. OLED maximum efficiency is 0.14 W/A.

The invention has been described in detail with particular reference to certain preferred embodiments thereof, but it will be understood that variations and modifications can be effected within the spirit and scope of the invention. The entire contents of the patents and other publications referred to in this specification are incorporated herein by reference.

PARTS LIST

101 Substrate
103 Anode
105 Hole-Injecting layer (HIL)
107 Hole-Transporting layer (HTL)
109 Light-Emitting layer (LEL)
110 Exciton or Hole Blocking Layer
111 Electron-Transporting layer (ETL)
112 Electron Injection Layer
113 Cathode
150 Current/Voltage source
160 Electrical conductors

What is claimed is:

1. An OLED device comprising a cathode, an anode, and located therebetween a light emitting layer containing a host compound, and further containing a light-emitting dopant compound represented by formula (I):

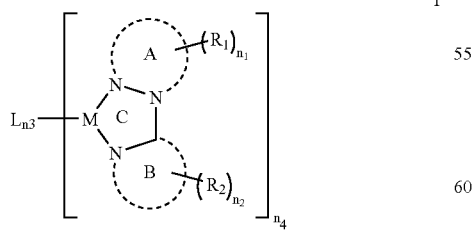

wherein
M is Iridium;
the coordination ring C is a triazole ring with the metal as a member of the triazole ring;

A is a five- or six-membered heteroaryl ring comprising at least two nitrogen atoms and is optionally substituted and optionally fused to one or more other aryl or heteroaryl rings;
B is a five membered heteroaryl ring substituted to contain fused ring D as represented by formula (III):

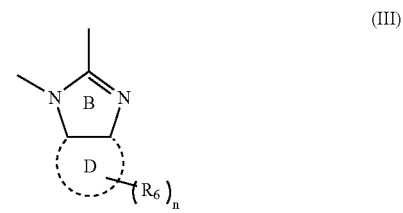

wherein:
ring D is an aryl or heteroaryl ring; $R_6$ is selected from alkyl, alkenyl, alkoxy, aryl, aralkyl, halogen, $NH_2$, NHR, $NR_2$, $NO_2$, CN, C(O)OR, C(O)R, C(O)NR, P(O)RR', P(S)RR', $SO_2$, SOR, $SO_2R$, $SO_3R$, BRR', and $B(OR)_2$ groups wherein each R or R' is independently selected from alkyl, alkenyl, alkynyl, aralkyl, and aryl groups; ring D may be optionally fused to one or more other aryl or heteroaryl rings and n is zero or an integer equal to or greater than one;
$R_1$ and $R_2$ are groups other than hydrogen and may be joined together;
$n_1$ and $n_2$ are independently an integer from 0 to 6;
L is a ligand and at least one L is 2-phenylpyridine or phenylpyrazole, wherein the phenylpyridine or phenylpyrazole ligand optionally is substituted with one or more alkyl, alkenyl, alkynyl, alkylaryl, CN, $CF_3$, COOR, C(O)R, $NR_2$, $NO_2$, OR, aryl, heteroaryl, substituted aryl, substituted heteroaryl or a heterocyclic group, and additionally, any two adjacent substituted positions together may form, independently, a fused 5- to 6-membered cyclic group, wherein said cyclic group is cycloalkyl, cycloheteroalkyl, aryl, or heteroaryl; and wherein the fused 5- to 6-membered cyclic group may be optionally substituted with one or more alkyl, alkenyl, alkynyl, alkylaryl, CN, $CF_3$, COOR, C(O)R, $NR_2$, $NO_2$, OR or halo; wherein each R is independently selected from alkyl, alkenyl, alkynyl, aralkyl, and aryl;
$n_3$ is zero or an integer;
and $n_4$ is an integer of at least one.

2. The device of claim 1 wherein ring A is represented by formula (II):

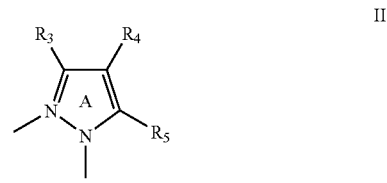

wherein:
$R_3$, $R_4$ and $R_5$ are selected from alkyl, alkenyl, alkoxy, aryl, aralkyl, halogen, $NH_2$, NHR, $NR_2$, $NO_2$, CN, C(O)OR, C(O)R, C(O)NR, P(O)RR', P(S)RR', $SO_2$, SOR, $SO_2R$, $SO_3R$, BRR', and $B(OR)_2$ wherein each R or R' is independently selected from alkyl, alkenyl, alkynyl, aralkyl, and aryl.

3. The device of claim 1 wherein the dopant compound is a homoleptic compound.

4. The device of claim 1 wherein the dopant compound is a heteroleptic compound.

5. The device of claim 1 wherein the dopant compound is represented by formula (IV):

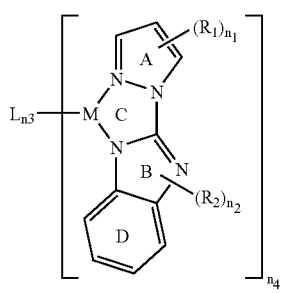

IV wherein:

M is Ir;

$R_1$ and $R_2$ are groups other than hydrogen;

$n_1$ and $n_2$ are independently an integer from 0 to 6;

L is a ligand and at least one L is 2-phenylpyridine or phenylpyrazole, wherein the phenylpyridine or phenylpyrazole ligand optionally is substituted with one or more alkyl, alkenyl, alkynyl, alkylaryl, CN , $CF_3$, COOR, C(O)R, $NR_2$, $NO_2$, OR, aryl, heteroaryl, substituted aryl, substituted heteroaryl or a heterocyclic group, and additionally, any two adjacent substituted positions together may form, independently, a fused 5- to 6-membered cyclic group, wherein said cyclic group is cycloalkyl, cycloheteroalkyl, aryl, or heteroaryl; and wherein the fused 5- to 6-membered cyclic group my be optionally substituted whit one or more alkyl, alkenyl, alkynyl, alkylaryl, CN, $CF_3$, COOR, C(O)R, $NR_2$, $NO_2$, OR or halo; wherein each R is independently selected from alkyl, alkenyl, alkynyl, aralkyl, and aryl;

$n_3$ is 0 or an integer up to 3 and $n_4$ is an integer from 1 to 3.

6. The device of claim 5 wherein the compound is a homoleptic compound.

7. The device of claim 5 wherein $n_3$ is an integer from 1 to 3.

8. The device of claim 1 wherein the light emitting layer contains at least two host materials.

9. The device of claim 1 wherein the device additionally contains an electron transport layer wherein the electron transport layer contains a combination of two or more materials.

* * * * *